(12) United States Patent  
Sato

(10) Patent No.: US 9,194,886 B2  
(45) Date of Patent: Nov. 24, 2015

(54) PROBE AND PROBE CARD

(71) Applicant: KABUSHIKI KAISHA NIHON MICRONICS, Musashino-shi, Tokyo (JP)

(72) Inventor: Minoru Sato, Musashino (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 116 days.

(21) Appl. No.: 13/836,387

(22) Filed: Mar. 15, 2013

(65) Prior Publication Data

US 2013/0265074 A1 Oct. 10, 2013

(30) Foreign Application Priority Data

Mar. 27, 2012 (JP) ................................. 2012-072014

(51) Int. Cl.
*G01R 1/067* (2006.01)
*G01R 1/073* (2006.01)

(52) U.S. Cl.
CPC ........ *G01R 1/06711* (2013.01); *G01R 1/07357* (2013.01); *G01R 1/06716* (2013.01); *G01R 1/06738* (2013.01)

(58) Field of Classification Search
CPC ............... G01R 1/07357; G01R 1/067; G01R 1/06755; G01R 1/06711–1/06738
USPC ............... 324/755.01–755.11, 754.1–754.18, 324/754.01–765.01
See application file for complete search history.

(56) References Cited

U.S. PATENT DOCUMENTS

| 2005/0151547 | A1* | 7/2005 | Machida et al. | 324/754 |
| 2006/0208751 | A1* | 9/2006 | Chen | 324/761 |
| 2008/0186042 | A1* | 8/2008 | Ko | 324/762 |
| 2008/0315893 | A1* | 12/2008 | Osato | 324/537 |
| 2009/0174421 | A1* | 7/2009 | Lee | 324/754 |
| 2010/0033201 | A1* | 2/2010 | Hsu et al. | 324/761 |
| 2010/0194415 | A1* | 8/2010 | Wajata | 324/754 |

(Continued)

FOREIGN PATENT DOCUMENTS

| JP | H09-54115 | 2/1997 |
| JP | 2006-84450 | 3/2006 |

(Continued)

OTHER PUBLICATIONS

Machine Translation of JP 2010091335 A—Mitsune Atshushi et al., "Contact Probe and Probe Card," Published Apr. 22, 2010.*

(Continued)

*Primary Examiner* — Arleen M Vazquez
*Assistant Examiner* — Lee Rodak
(74) *Attorney, Agent, or Firm* — Bacon & Thomas, PLLC

(57) ABSTRACT

A probe is provided with a linear main body portion having a tip in contact with an electrode of a member to be tested in a state where a board-side end is in contact with the circuit board side of a probe card. An elastic support portion is provided on a board-side end portion of the main body portion and elastically supports the main body portion on the probe card side. The support portion has its base end side integrally fixed to the board-side end portion and is formed with the distal end side directed toward the tip portion of the main body portion and curved having an arc shape toward the main body portion side. Two pieces of the support portion are provided symmetrically on both sides sandwiching the board-side end portion and are configured by being curved, each having an arc shape with the same radius of curvature.

8 Claims, 12 Drawing Sheets

(56) References Cited

U.S. PATENT DOCUMENTS

| | | | |
|---|---|---|---|
| 2010/0231249 A1* | 9/2010 | Dang et al. | 324/758 |
| 2011/0006796 A1* | 1/2011 | Kister et al. | 324/756.01 |
| 2011/0169516 A1* | 7/2011 | McFarland | 324/755.05 |
| 2013/0069683 A1* | 3/2013 | Kuo et al. | 324/755.03 |

FOREIGN PATENT DOCUMENTS

| | | |
|---|---|---|
| JP | 2008-292327 | 12/2008 |
| JP | 2009-527759 | 7/2009 |
| JP | 2010-91335 | 4/2010 |
| JP | 2010091335 A * | 4/2010 |
| KR | 10-2009-0122620 | 12/2009 |
| WO | 2007/097559 | 8/2007 |
| WO | WO 2007097559 A1 * | 8/2007 |

OTHER PUBLICATIONS

First Office Action for Korean Patent Application No. 10-2013-0027116 issued on Feb. 26, 2014.

* cited by examiner

PROBE AND PROBE CARD

CROSS-REFERENCE TO RELATED APPLICATION

This application claims, under 35 USC 119, priority of Japanese Application No. 2012-072014 filed on Mar. 27, 2012.

BACK GROUND OF THE INVENTION

1. Technical Field Relating to the Invention

The present invention relates to a probe whose tip is in contact with an electrode of a member to be tested in a state where a board-side end is in contact with a circuit board side and a probe card using this probe.

2. Description of Related Art

A probe for testing a member to be tested such as an LSI chip is incorporated in a probe card. Usually, a large number of probes are incorporated in a probe card, and this probe card is incorporated in a testing device (tester). As a result, each probe has its board-side end brought into contact with a circuit board side of the probe card, while its tip is brought into contact with an electrode of the member to be tested, and a test signal or the like is applied.

An example of such probe card is disclosed in a vertical probe card described in Patent Document 1 (Japanese Patent Laid-Open No. H09-54115). This vertical probe card will be described on the basis of FIGS. 1 and 2. The vertical probe card is a probe card for measuring electrical characteristics of an LSI chip (not shown).

This vertical probe card includes a probe 2 whose contact portion 1 at the tip is brought into contact with an electrode pad of an object to be measured (not shown), a support portion 3 for supporting this probe 2 movably only in a vertical direction, and a circuit board 7 having a conductive pattern 6 electrically connected to a contact portion 5 on a rear end of the probe 2 by an elastic body 4 having conductivity.

The probe 2 is formed having a rod shape, and the contact portion 1 at the tip thereof is formed having a small spherical body and the contact portion 5 on the rear end thereof having a large spherical body.

The support portion 3 is composed by connecting an upper support plate 8 and lower support plates 9 and 10 to each other and is mounted on the circuit board 7. In the upper support plate 8 and the lower support plates 9, and 10, a plurality of through holes 8A, 9A, and 10A corresponding to arrangement of electrode pads of the LSI chip are provided.

The conductive patterns 6 of the circuit board 7 are mutually connected by a through hole 11. The elastic body 4 is provided on the lower side of the through hole 11. The through hole 11 and the elastic body 4 are provided at positions corresponding to arrangement of each of the electrode pads of the LSI chip, respectively, on the lower surface of the circuit board 7. This elastic body 4 is molded into a funnel shape, and a radial cut 12 is formed at the center. The elastic body 4 is electrically connected to the through hole 11.

A gap is present between the contact portion 5 of the probe 2 and the elastic body 4 on the circuit board 7 side. In this gap, a contact pressure does not occur after the contact portion 1 of the probe 2 is brought into contact with the electrode pad of the LSI chip and until the contact portion 5 of the probe 2 is brought into contact with the elastic body 4. The contact pressure occurs after the contact portion 5 is brought into contact with the elastic body 4. As a result, after the contact portion 1 is brought into contact with the electrode pad of the LSI chip, the contact portion 1 no longer shifts its position.

Moreover, as another example of a rod-shaped probe, Patent Document 2 (Japanese Patent Laid-Open No. 2008-292327) discloses a probe unit. This probe unit is, as illustrated in FIG. 3, composed of a plurality of probe pins 13, a main body portion 14, and an electrode plate 15. The probe pin 13 is formed having a needle shape (columnar shape) as a whole. The main body portion 14 includes a first support portion 16, a second support portion 17, and a connection portion (not shown). The probe pin 13 is inserted through an insertion hole 16A of the first support portion 16 and an insertion hole 17A of the second support portion 17. A stopper 18 is provided at the board-side end portion of the probe pin 13. This stopper 18 is brought into contact with the second support portion 17, and the probe pin 13 is supported by the second support portion 17. The board-side end portion of the probe pin 13 supported on the support portion 17 by the stopper 18 is brought into electrical contact with the electrode plate 15.

Other than above, though the supporting direction is reversed, Patent Document 3 (Japanese Patent Laid-Open No. 2006-84450) discloses an example in which a flange similar to the stopper 18 supporting the rod-shaped probe is provided, and Patent Document 4 (Japanese Patent Laid-Open No. 2009-527759) discloses an example in which a locking projection similar to the stopper 18 is provided on the tip side and the board-side end side.

SUMMARY OF INVENTION

The vertical probe card in the above-described Patent Document 1 does not have a structure in which the probe 2 is biased to the circuit board 7 side all the time. Thus, in a no-drive state in which the probe 2 is not in contact with the electrode pad of the LSI chip (state where the probe 2 is not in contact with the electrode pad of the LSI chip), the contact portion 5 of the probe 2 is not in contact with the elastic body 4 on the circuit board 7 side. If the probe card is pressed toward the LSI chip, the probe 2 is brought into contact with the electrode pad of the LSI chip, and the probe 2 rises by a reaction force while keeping the state (overdrive). That is, if the probe 2 is biased to the circuit board 7 side, the contact portion 5 of the probe 2 is brought into contact with the elastic body 4, and the electrode pad of the LSI chip and the tester side are electrically conducted via the probe 2.

Also in the other Patent Documents, since the probe is not constructed to be biased to the circuit board side, the probe and the circuit board side are brought into electric contact with each other reliably by overdrive.

On the other hand, in the recent tests of the LSI chip and the like, sometimes a high current (approximately 1 A, for example) is passed, and thus a spark causes a problem. That is, if a gap is generated between the probe and the circuit board due to release of overdrive from the state where the probe is electrically connected with the circuit board side or due to a positional shift of the probe and the like, a spark is generated, which might cause problems such as burnout and removal of the probe resulting in requiring repair.

The present invention was made in view of the above-described problems and has an object to provide a probe and a probe card that can suppress occurrence of a spark and prevent burnout or removal of the probe.

A probe according to the present invention is a probe provided with a linear main body portion having a tip in contact with an electrode of a member to be tested in a state where a board-side end is in contact with the circuit board side of a probe card and an elastic support portion which is provided on a board-side end portion of the main body portion and elastically supports the main body portion on the probe card side. The elastic support portion has its base end side integrally fixed to the board-side end portion of the main body portion and is formed with the distal end side directed toward the tip portion of the main body portion and curved having an arc shape toward the main body portion side. Moreover, two pieces of the elastic support portions are provided symmetrically on the both sides sandwiching the main body portion on the board-side end portion of the main body portion and they are configured by being curved, each having an arc shape with the same radius of curvature. The above-described probe is used as a probe to be provided in plural in the probe card.

In the probe according to the present invention, since the board-side end portion is in a state in contact with the circuit board end side all the time, generation of a spark when the probe and the circuit board are spaced away from each other from a state where they are electrically connected once, is suppressed and burnout or removal of the probe can be prevented.

DETAILED DESCRIPTION OF THE PREFERRED EMBODIMENTS

A probe and a probe card according to an embodiment of the present invention will be described below by referring to the attached drawings. As the probe card of this embodiment, any probe card (vertical probe card) in which the probe of this embodiment can be incorporated can be used. The above-described prior-art probe card can be also used. Thus, the probe card will be outlined and then, mainly the probe will be described below.

Figure 1:
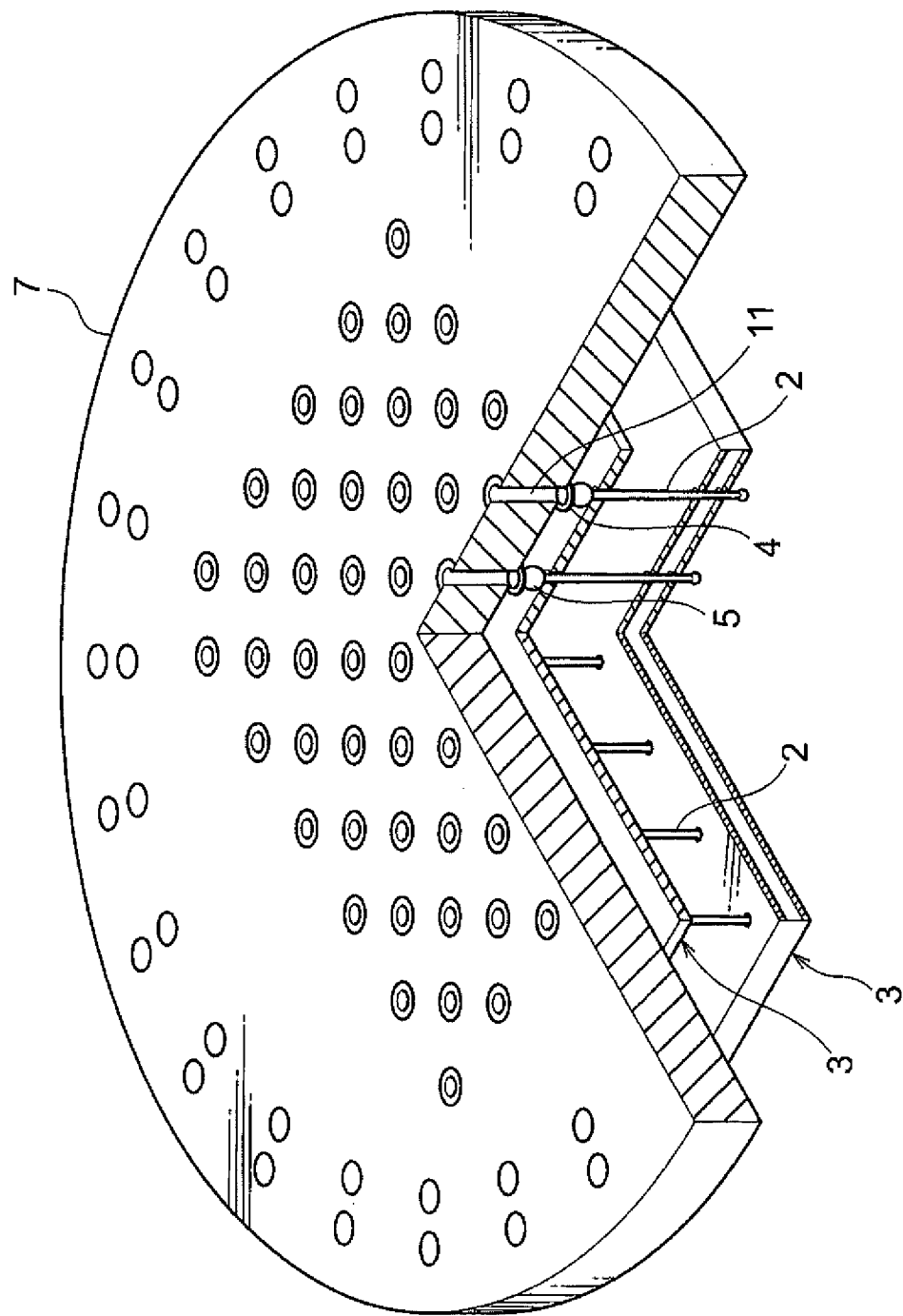
FIG. 1 is a partial sectional perspective view illustrating a probe card according to a first prior-art example.
Figure 2:
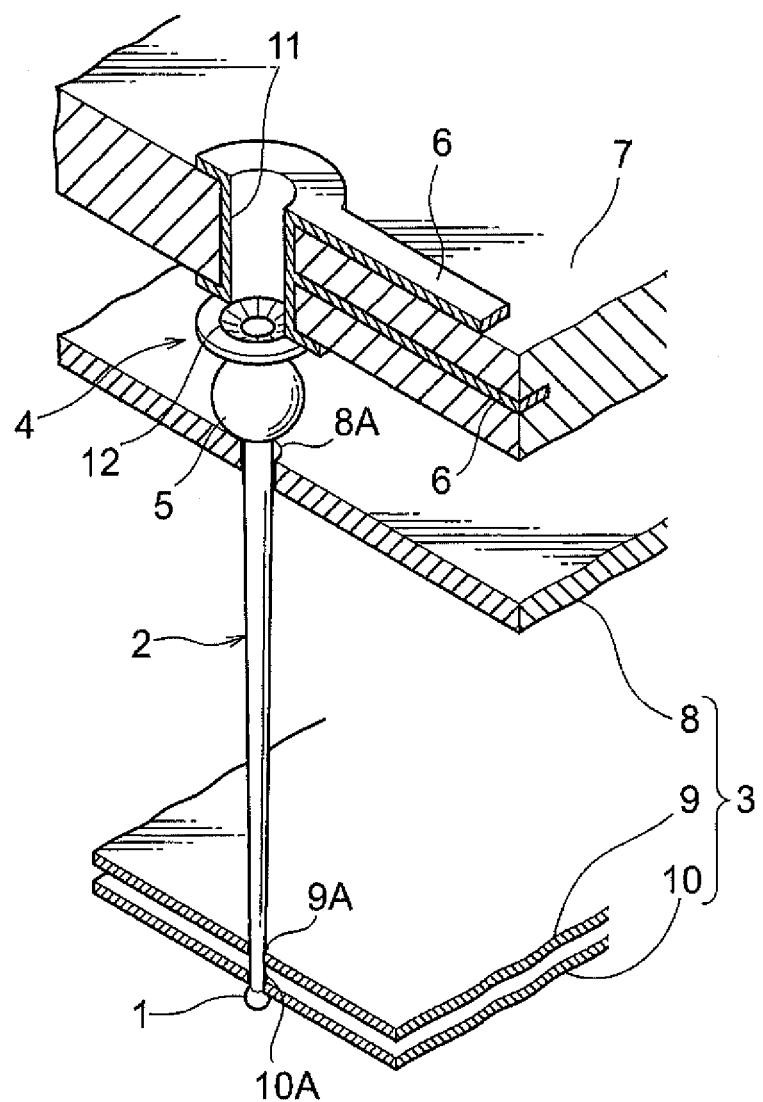
FIG. 2 is a sectional perspective view of an essential part illustrating the probe card according to the first prior-art example.
Figure 3:
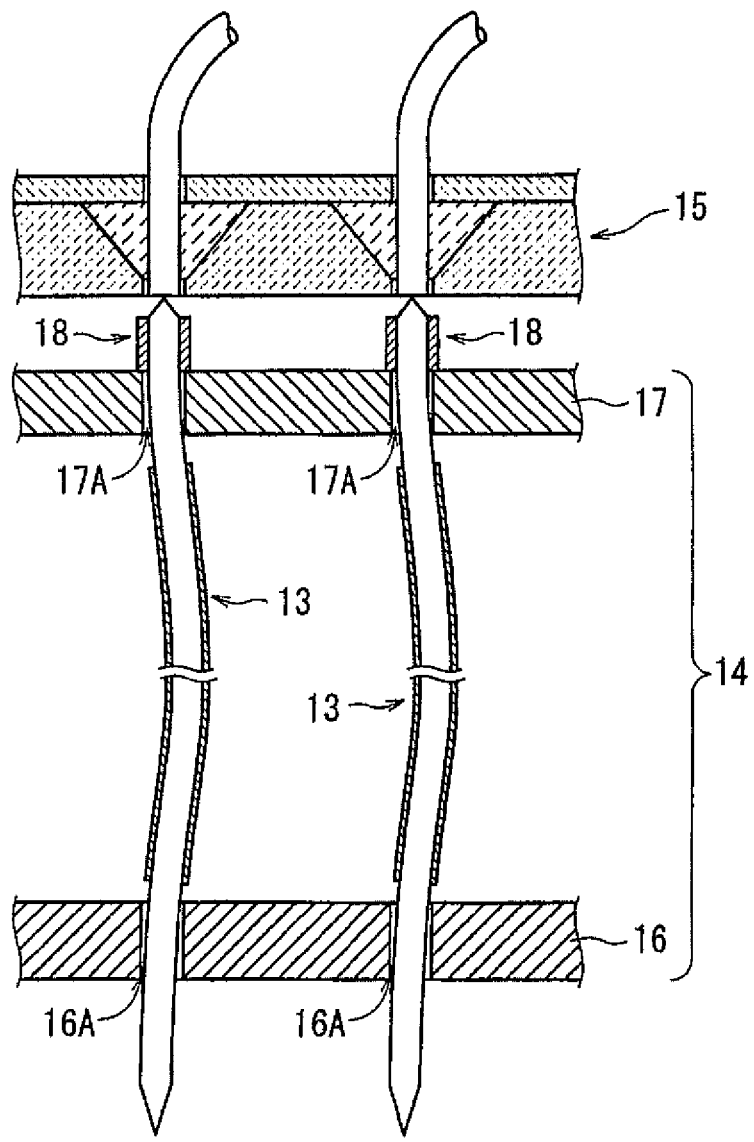
FIG. 3 is a sectional view of an essential part illustrating a probe card according to a second prior-art example.
Figure 4:
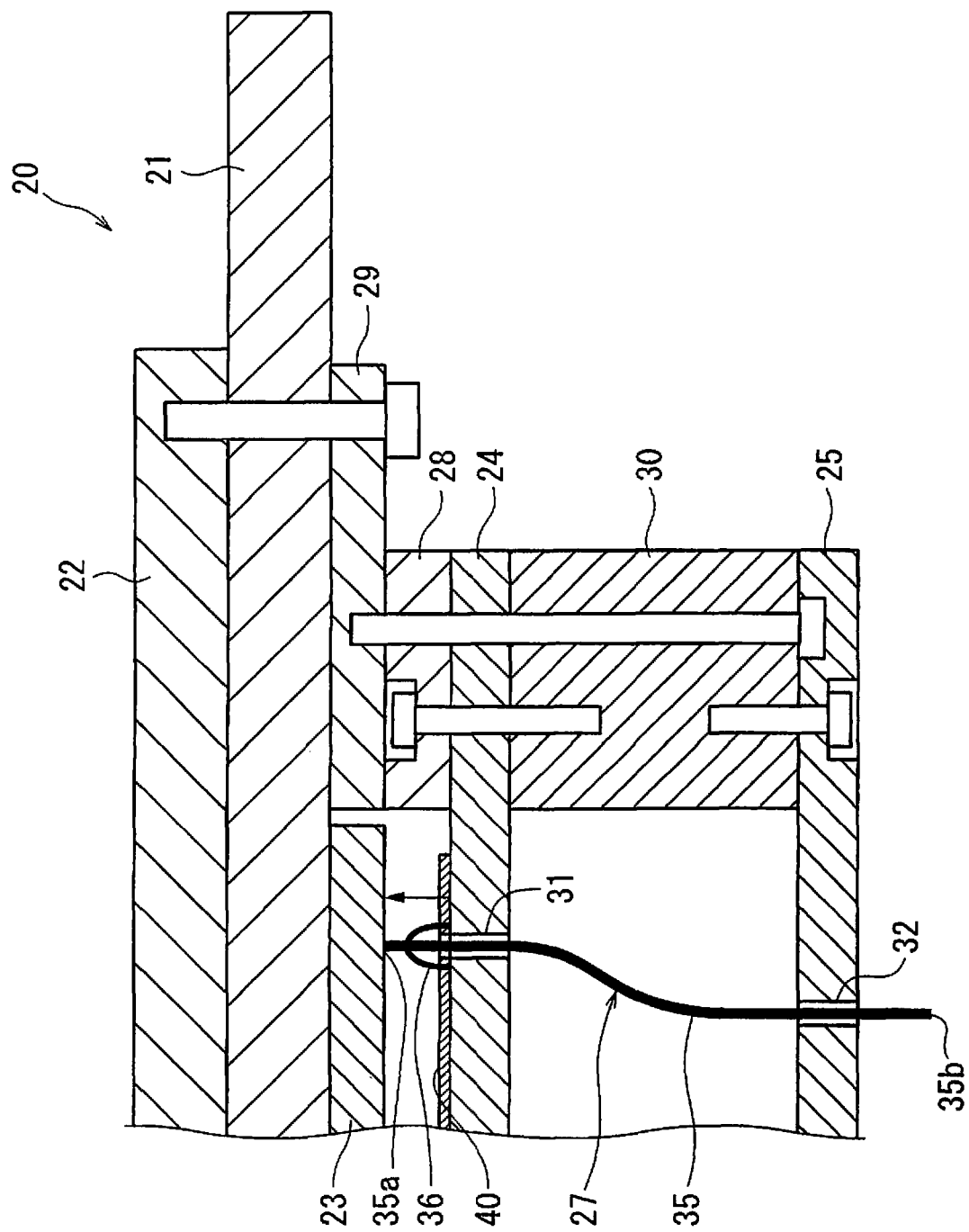
FIG. 4 is a sectional view of an essential part illustrating a probe card according to an embodiment of the present invention.

A probe card 20 is, as illustrated in FIG. 4, mainly composed of a main board 21, a reinforcing plate 22, an interposer 23, a probe head top plate 24, and a probe head bottom plate 25.

The reinforcing plate 22 is mounted on the upper side surface of the main board 21 and reinforces the main board 21. The interposer 23 is mounted on the lower side surface of the main board 21. This interposer 23 has a conductor wire 23A (See FIG. 14) provided therein. The interposer 23 electrically connects probes 27 attached in a large number to the probe card 20 to wiring (not shown) of the main board 21. The probe head top plate 24 is mounted on the main board 21 through spacers 28 and 29. The probe head bottom plate 25 is mounted together with the probe head top plate 24 on the main board 21 through a spacer 30.

A large number of probe holes 31 are provided in the probe head top plate 24. Each of the probe holes 31 is provided at a position matching the conductor wire 23A on the lower side surface of the interposer 23. A large number of probe holes 32 are provided in the probe head bottom plate 25. Each of the probe holes 32 is provided at a position matching each electrode such as an LSI chip (not shown) to be tested attached in a testing device.

Figure 5:
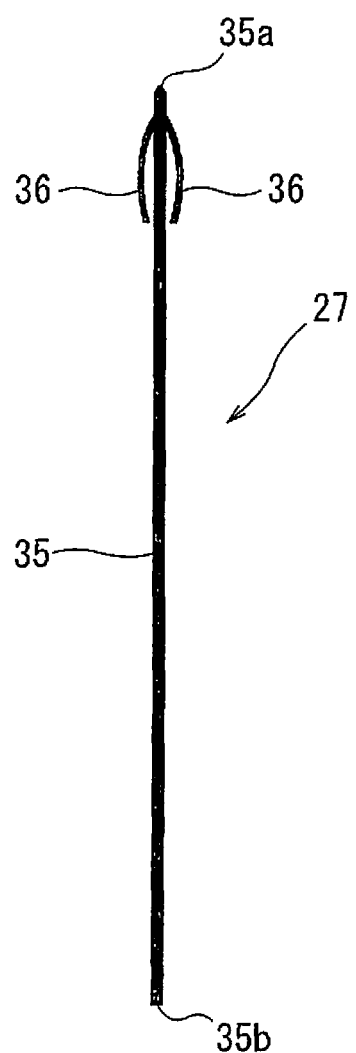
FIG. 5 is a front view illustrating a probe according to the embodiment of the present invention.

The probe 27 is attached by being inserted through the probe hole 31 in the probe head top plate 24 and the probe hole 32 of the probe head bottom plate 25. The probe 27 is, as illustrated in FIGS. 4 and 5, composed of a main body portion 35 and an elastic support portion 36. In this embodiment, the entire length of the main body portion 35 is approximately 2 mm, and the entire length of the elastic support portion 36 is approximately 0.15 mm.

The main body portion 35 is a linear member for electrically connecting each of the conductor wires 23A of the interposer 23 to each of the electrodes such as an LSI chip and the like. The main body portion 35 is a conductive material having elasticity and formed having a square rod shape, for example. Since the main body portion 35 can have any shape as long as it can be in contact with the electrode while elastically deflecting and being electrically connected thereto, the sectional shape of the main body portion 35 is not limited to a square (square rod) but may be a rod shape having a sectional shape of any of other polygons, a circle, an ellipse, a plate, a thin plate and the like.

The main body portion 35 is inserted through the probe hole 31 of the probe head top plate 24 and the probe hole 32 of the probe head bottom plate 25. As a result, in a state where a board-side end 35a (upper end in the figure) of the main body portion 35 is in contact with the interposer 23 on the main board 21 side, a tip 35b (lower end in the figure) of the main body portion 35 is brought into contact with the electrode of the member to be tested.

The elastic support portion 36 is a member for elastically supporting the main body portion 35 on the probe card 20 side. The elastic support portion 36 is formed of a conductive material having elasticity similarly to the main body portion 35 and has a square rod shape, for example. This elastic support portion 36 may also have a rod shape having a sectional shape of any of other polygons, a circle, an ellipse, a plate, a thin plate and the like similarly to the main body portion 35.

The elastic support portion 36 is provided on the board-side end 35a side of the main body portion 35. The elastic support portion 36 has its base end 36a integrally fixed to the board-side end 35a of the main body portion 35, and a distal end 36b becomes a free end and is disposed toward the tip portion of the main body portion 35.

Figure 6:
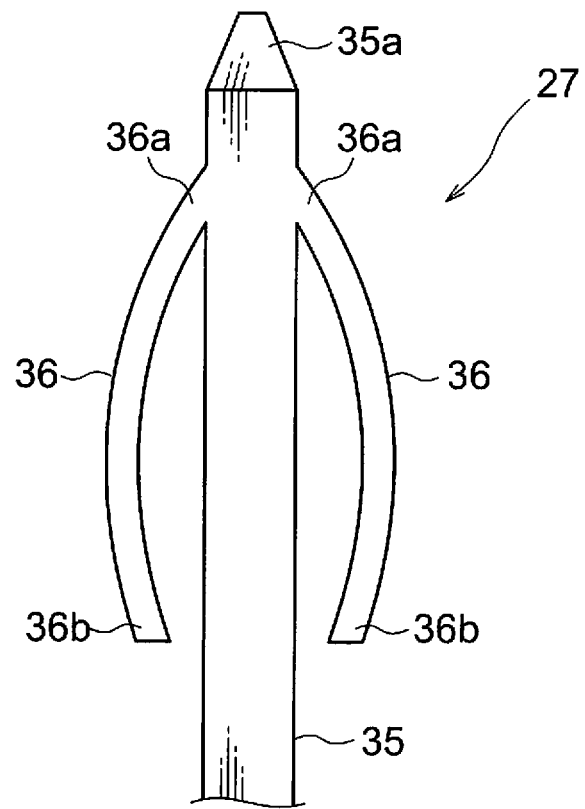
FIG. 6 is an enlarged view of an essential part illustrating the probe according to the embodiment of the present invention.
Figure 7:
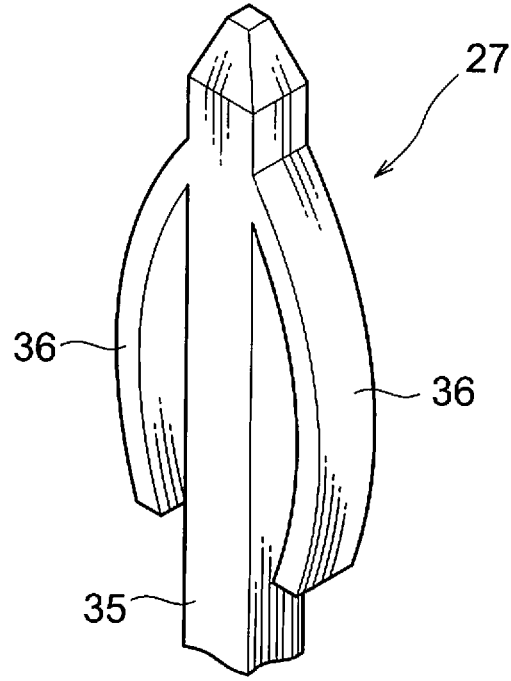
FIG. 7 is an enlarged perspective view of the essential part illustrating the probe according to the embodiment of the present invention.
Figure 8:
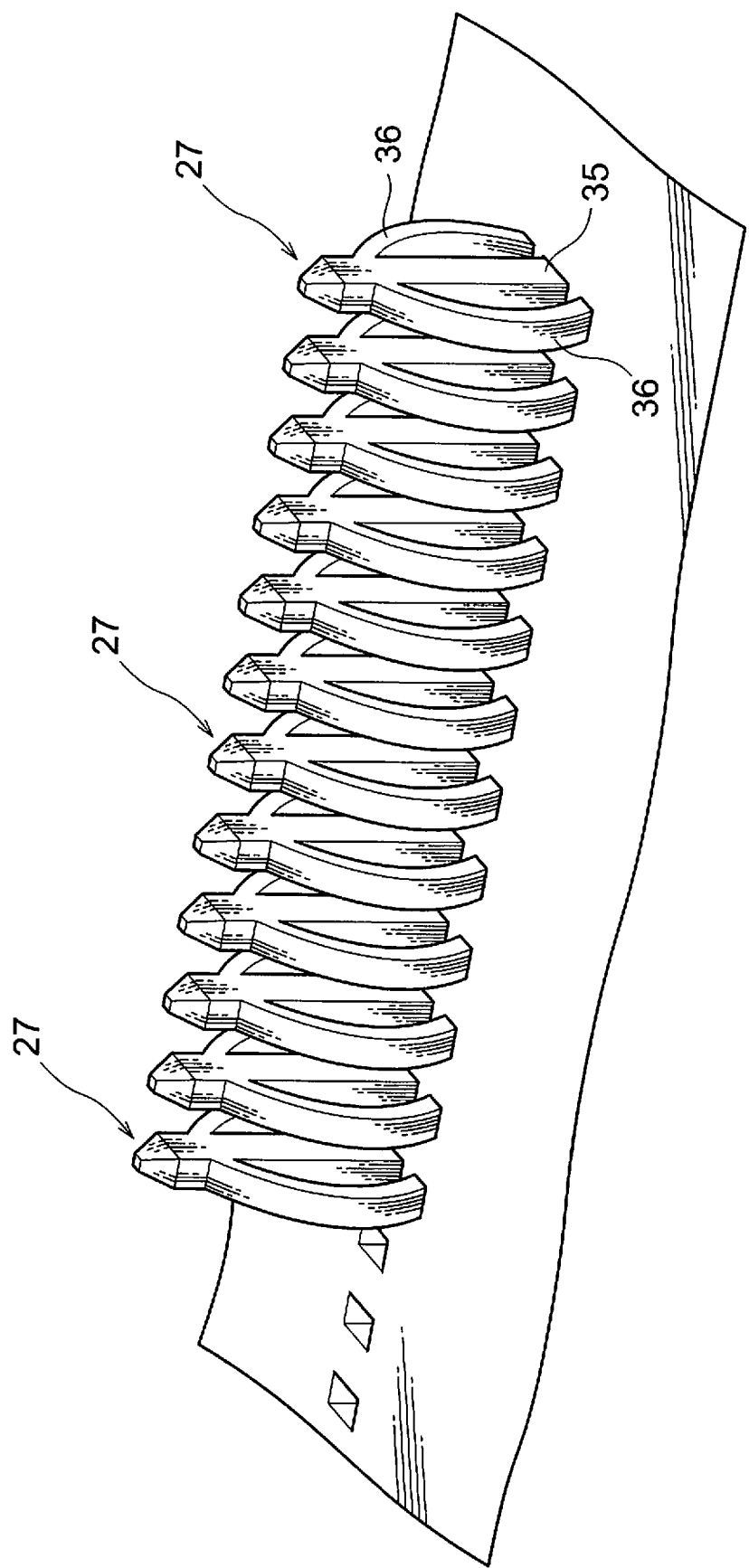
FIG. 8 is a perspective view illustrating a mounting example of the probe according to the embodiment of the present invention.

Two pieces of the elastic support portion 36 are, as illustrated in FIGS. 6 to 8, provided symmetrically on the both sides sandwiching the main body portion 35 on the board-side end 35a side of the main body portion 35. The elastic support portions 36 are formed by being curved, each having an arc shape. Specifically, the elastic support portions 36 are formed by being curved, each having an arc shape with the same radius of curvature. The curvature of this elastic support portion 36 may be changed by a position to be arranged, a length of the probe 35 and the like. For example, the curvature of the elastic support portion 36 on the base end 36a side may be made small and the curvature on the distal end 36b side may be made larger. As a result, the distal end 36b side of the elastic support portion 36 in contact with the probe head top plate 24 side is not much curved but firmly holds on so that the base end 36a side of the elastic support portion 36 is largely curved and elastically supports the main body portion 35.

Figure 9:
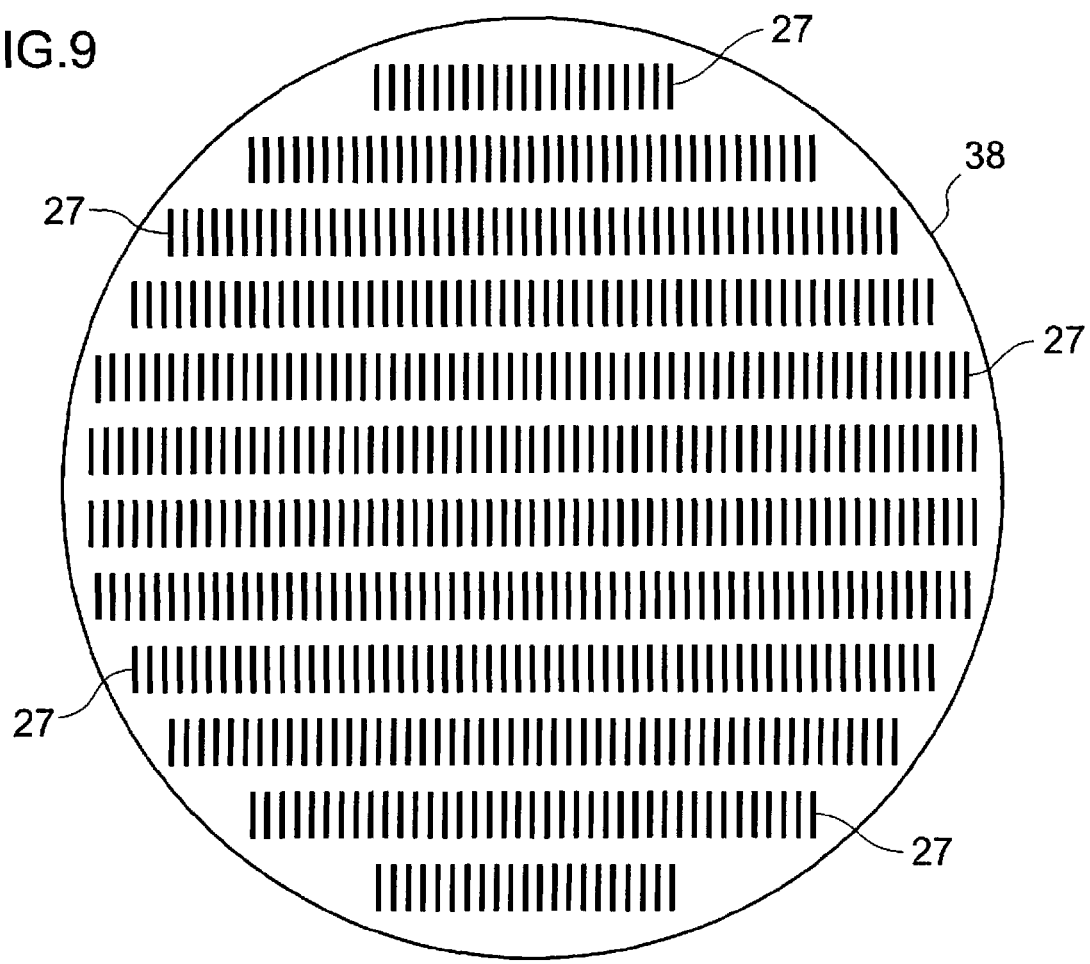
FIG. 9 is a plan view illustrating a semiconductor wafer for manufacturing the probe according to the embodiment of the present invention.

The probe 27 is manufactured by a photolithography process on a substrate 38 such as a silicon wafer as illustrated in FIG. 9, for example.

Figure 10:
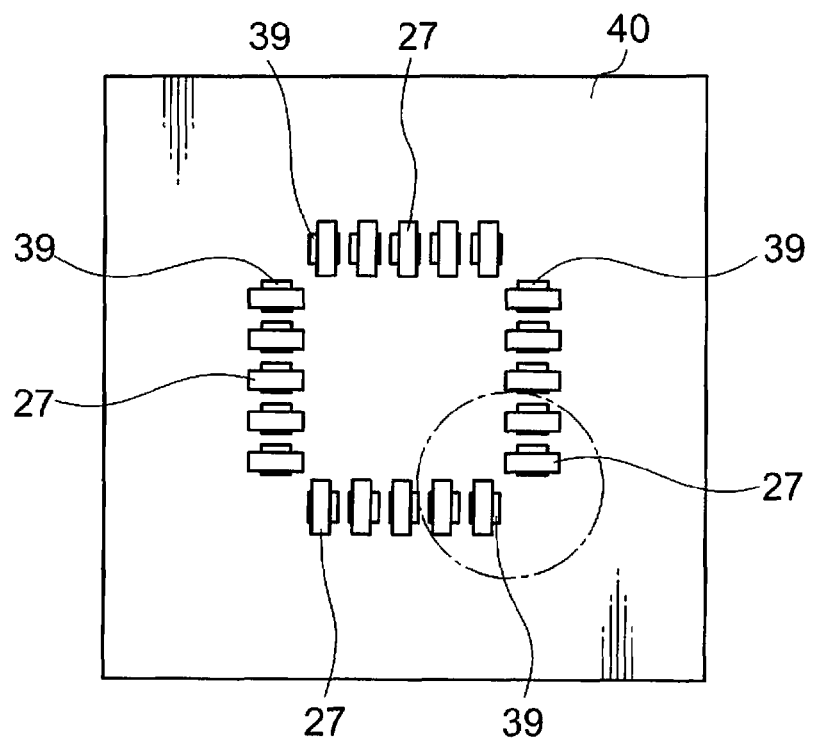
FIG. 10 is a plan view illustrating a state where the probe according to the embodiment of the present invention is attached to a top film.
Figure 11:
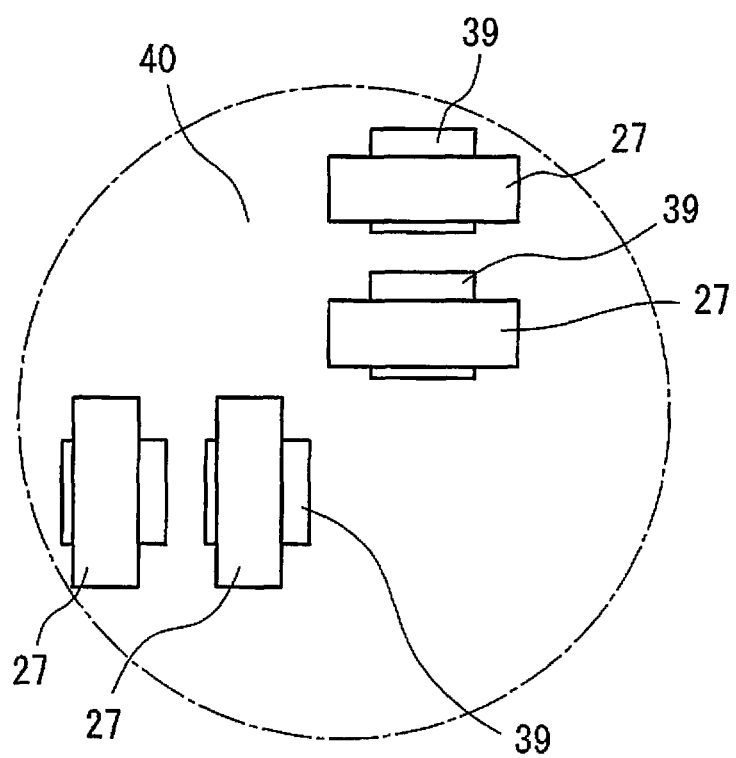
FIG. 11 is an enlarged view of a circular portion in FIG. 10.
Figure 12:
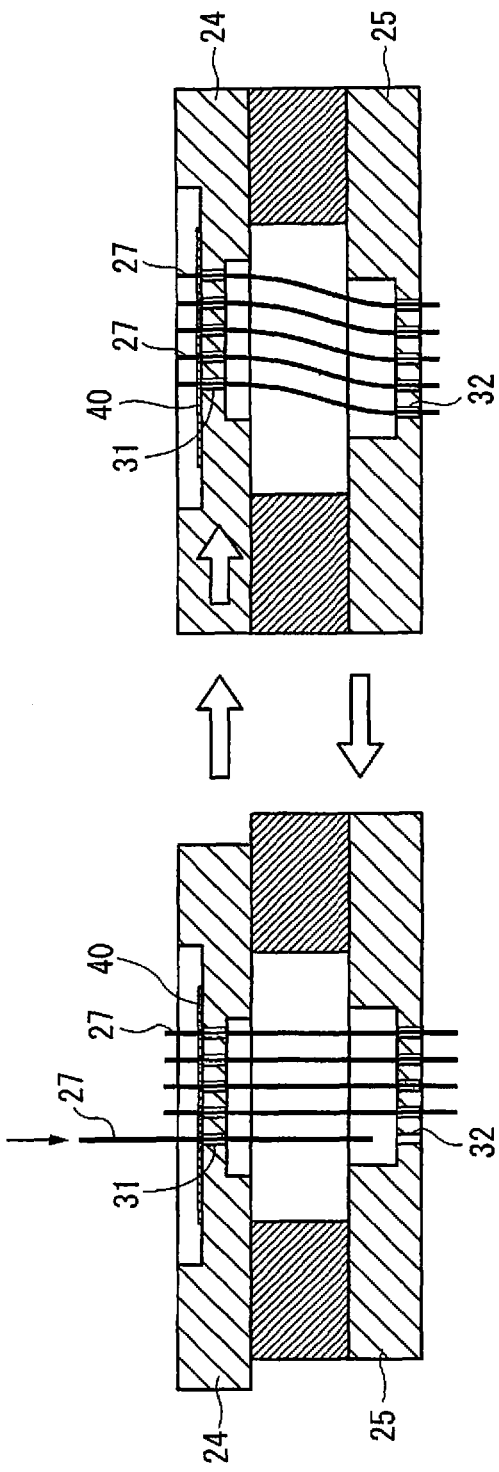
FIGS. 12A and 12B are schematic views illustrating an example of attaching the probe according to the embodiment of the present invention to a probe card.

The probe 27 configured as above is incorporated in the probe card 20 as illustrated in FIGS. 10 to 12.

As illustrated in FIGS. 10 and 11, insertion holes 39 are provided at a plurality of setting positions, and the probe 27 is inserted through each of the insertion holes 39 from the upper side of a top film 40 placed on the probe head top plate 24, and further inserted through the probe hole 31. At this time, each of the insertion holes 39 of the top film 40 is provided at a position matching each of the probe holes 31 of the probe head top plate 24. Moreover, the insertion hole 39 is formed having a square hole shape in compliance with the main body portion 35 of the probe 27. As a result, the probe 27 inserted through the insertion hole 39 has its rotation direction regulated by this insertion hole 39. Moreover, the probe head top plate 24 is adjusted at a position where the probe hole 31 of the probe head top plate 24 and the probe hole 32 of the probe head bottom plate 25 match each other when offset which will be described later is released.

In this state, each of the probes 27 is inserted through each of the insertion holes 39 and the probe holes 31, respectively. As a result, as illustrated in FIG. 12 (A), each of the probes 27 is inserted into the probe hole 31 of the probe head top plate 24 and the probe hole 32 of the probe head bottom plate 25 through each of the insertion holes 39. Then, as illustrated in FIG. 12 (B), the probe head top plate 24 is offset in the horizontal direction and fixed.

Figure 13:
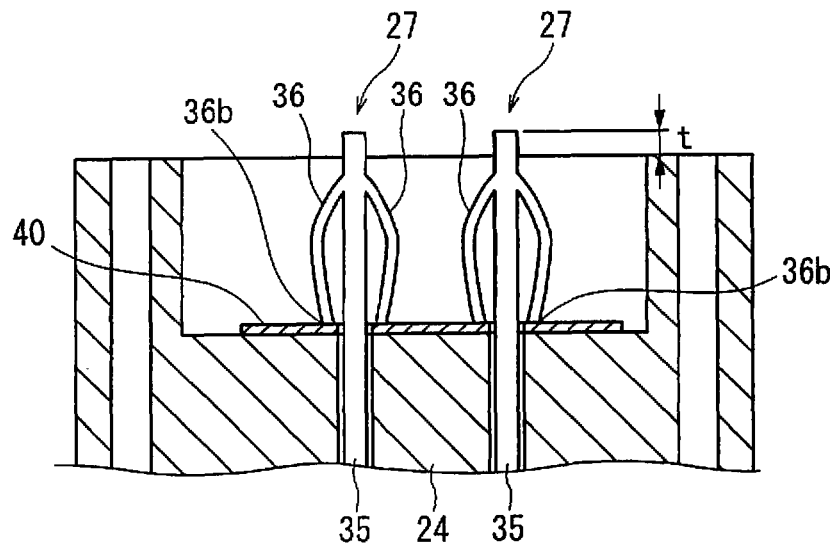
FIG. 13 is a sectional view illustrating a state where the probe according to the embodiment of the present invention is attached to a probe head top plate.

If the probe 27 is to be replaced, the probe 27 at a specified position or all the probes 27 are replaced through a process opposite to the above-described process. At this time, on the board-side end portion of the probe 27, as illustrated in FIG. 13, the elastic support portion 36 is in contact with the top film 40 in a state substantially without sagging and supports the main body portion 35. At this time, the upper end portion of the main body portion protrudes approximately by 30 μm as illustrated as reference character t in FIG. 13.

Figure 14:
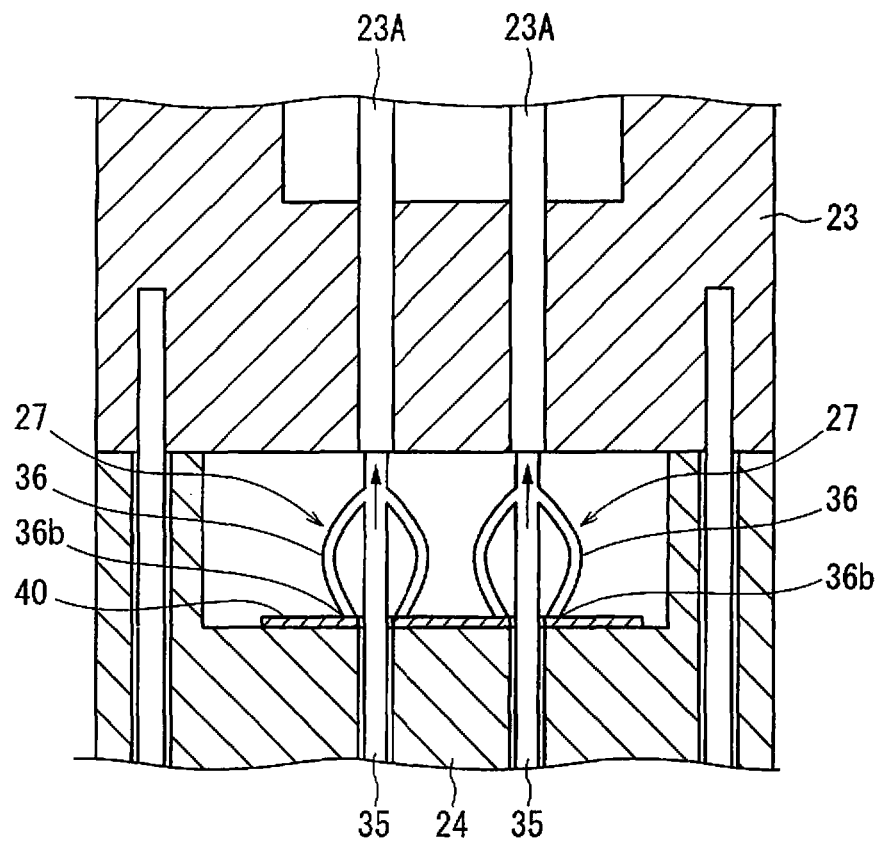
FIG. 14 is a sectional view illustrating a state where the probe head top plate on which the probe according to the embodiment of the present invention is attached is mounted on an interposer.

Subsequently, by mounting the probe head top plate 24 and the probe head bottom plate 25 on the main board side, as illustrated in FIG. 14, the board-side end portion of the main body portion 35 is brought into contact with the conductor wire 23A of the interposer 23, and the main body portion 35 is pressed downward.

As a result, the elastic support portion 36 has its distal end 36b brought into contact with the top film 40 and is curved. As a result, the main body portion 35 is elastically supported and biased upward, and the board-side end 35a of the main body portion 35 enters a state in contact with the conductor wire 23A of the interposer 23 all the time.

Then, incorporation of the probe 27 into the probe card 20 is completed.

If the probe card 20 is to be incorporated in a testing device and tested, the tip 35b of the main body portion 35 of the probe 27 is brought into contact with each electrode of the LSI chip or the like and a signal current is made to flow. At this time, since the board-side end 35a of the main body portion 35 of the probe 27 is electrically connected with the conductor wire 23A of the interposer 23 all the time, a spark caused by separation of the both do not occur.

As a result, the probe 27 can be reliably prevented from being burned out or removed due to the burnout.

As a result, durability and reliability of the probe card 20 incorporating the probe 27 are improved.

[Variation]

Figure 15:
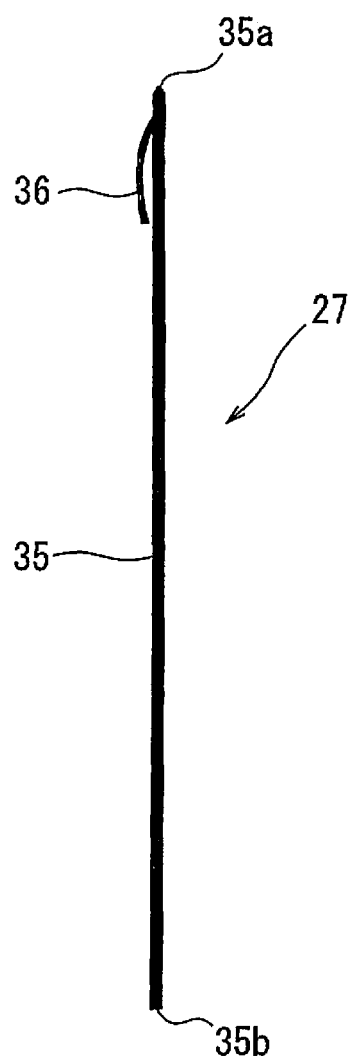
FIG. 15 is a front view illustrating a variation of the probe according to the embodiment of the present invention.

In the above embodiment, two pieces of the elastic support portion 36 for the probe 27 are provided on the both sides of the main body portion 35, but as illustrated in FIG. 15, only one piece of the elastic support portion 36 may be provided on the main body portion 35. In this case, too, the elastic support portion 36 can elastically support the main body portion 35, and the action and effects similar to the above-described embodiment can be exerted.

The present invention is not limited to the above-described embodiment but includes various modifications that could have been conceived of by those skilled in the art, and the effects of the present invention are also not limited to the contents described above. That is, various addition, changes, partial deletion and the like within a range not departing from the conceptual idea and the gist of the present invention derived from the contents specified in claims and the equivalents thereof are possible.

The invention claimed is:

1. A probe comprising:
   a linear main body portion extending through a probe head having a top plate and a bottom plate, the linear main body portion having a tip in contact with an electrode of a member to be tested and a board-side end in contact with a circuit board side of a probe card positioned above the top plate of the probe head; and
   an elastic support portion which is provided on a board-side end portion of the main body portion and positioned between the circuit board side of the probe card and the top plate of the probe head, and which elastically supports the main body portion on a probe card side of the probe head, wherein the elastic support portion has a base end side integrally fixed to the board-side end portion of the main body portion and having a distal end side directed toward a tip portion of the main body portion, and
   two pieces of the elastic support portion are provided symmetrically on two sides sandwiching the main body portion on the board-side end portion of the main body portion, each piece having an arc shape with a same radius of curvature and a distal end that curves toward the main body portion.

2. The probe according to claim 1, wherein the main body portion is a conductive material having elasticity.

3. The probe according to claim 1, wherein the main body portion is inserted through a probe hole of the top plate and a probe hole of the bottom plate and the tip of the main body portion is brought into contact with the electrode of the member to be tested in a state while the board-side end of the main body portion is in contact with an interposer on the circuit board side of the probe card.

4. The probe according to claim 1, wherein
the elastic support portion is a conductive material having elasticity.

5. The probe according to claim 1, wherein
the distal end side of each piece of the elastic support portion includes a free end disposed toward the tip portion of the main body portion.

6. The probe according to claim 1, wherein
the elastic support portion is formed by being curved having an arc shape having the same radius of curvature over its entire length.

7. The probe according to claim 1, wherein
each piece of the elastic support portion has a curvature on its base end side that is smaller than a curvature on the distal end side.

8. The probe according to claim 1, wherein the probe is one of a plurality of probes provided in a probe card.

\* \* \* \* \*